United States Patent [19]
Khawand et al.

[11] Patent Number: 5,455,774
[45] Date of Patent: Oct. 3, 1995

[54] INTERRUPT PROGRAMMABLE ANALOG-TO-DIGITAL PORT

[75] Inventors: Charbel Khawand, Miami; Karl R. Weiss, Plantation both of Fla.

[73] Assignee: Motorola, Inc., Schaumburg, Ill.

[21] Appl. No.: 964,801

[22] Filed: Oct. 22, 1992

[51] Int. Cl.⁶ .................................................. G06F 17/00
[52] U.S. Cl. ................................................................ 364/483
[58] Field of Search ................................ 364/483, 140, 364/241.1, 241.4, 242.1, 941.1, 579; 395/750; 340/825.06; 455/89

[56] References Cited

U.S. PATENT DOCUMENTS

| | | |
|---|---|---|
| 4,006,454 | 2/1977 | Beseke et al. . |
| 4,390,963 | 6/1983 | Puhl et al. . |
| 4,398,265 | 9/1983 | Puhl et al. . |
| 4,434,461 | 2/1984 | Puhl . |
| 4,794,525 | 12/1988 | Pickert et al. . |
| 4,851,829 | 7/1989 | De Luca et al. . |
| 4,862,409 | 8/1989 | Nix . |
| 4,878,710 | 10/1989 | Reed et al. . |
| 4,897,810 | 1/1990 | Nix . |
| 4,977,530 | 12/1990 | Cline et al. ............... 364/579 |
| 4,979,102 | 12/1990 | Tokuume . |
| 5,001,666 | 3/1991 | Thompson et al. . |
| 5,043,861 | 8/1991 | Diekhans et al. ............ 364/140 |
| 5,051,945 | 9/1991 | Hayashi . |
| 5,095,526 | 3/1992 | Baum . |
| 5,146,597 | 9/1992 | Williams . |
| 5,201,066 | 4/1993 | Kim ............................ 455/89 |
| 5,237,592 | 8/1993 | Nonami ................. 340/825.06 |
| 5,237,699 | 8/1993 | Little et al. ............... 364/941.1 |

Primary Examiner—Ellis B. Ramirez
Attorney, Agent, or Firm—Andrew S. Fuller; Juliana Agon

[57] ABSTRACT

A voltage monitoring method and apparatus starts with the operation of a normal microcomputer program flow, in a microcomputer (40). An input voltage source (90) is converted to a current digital output word (581) representative of the instantaneous amplitudes of the input voltage source (90). A threshold condition (562) is set ahead of time. When the current digital output word (581) satisfies the threshold condition (582), an interrupt signal (36) is generated. Finally, the normal microcomputer program flow is interrupted in response to the interrupt signal (36).

2 Claims, 4 Drawing Sheets

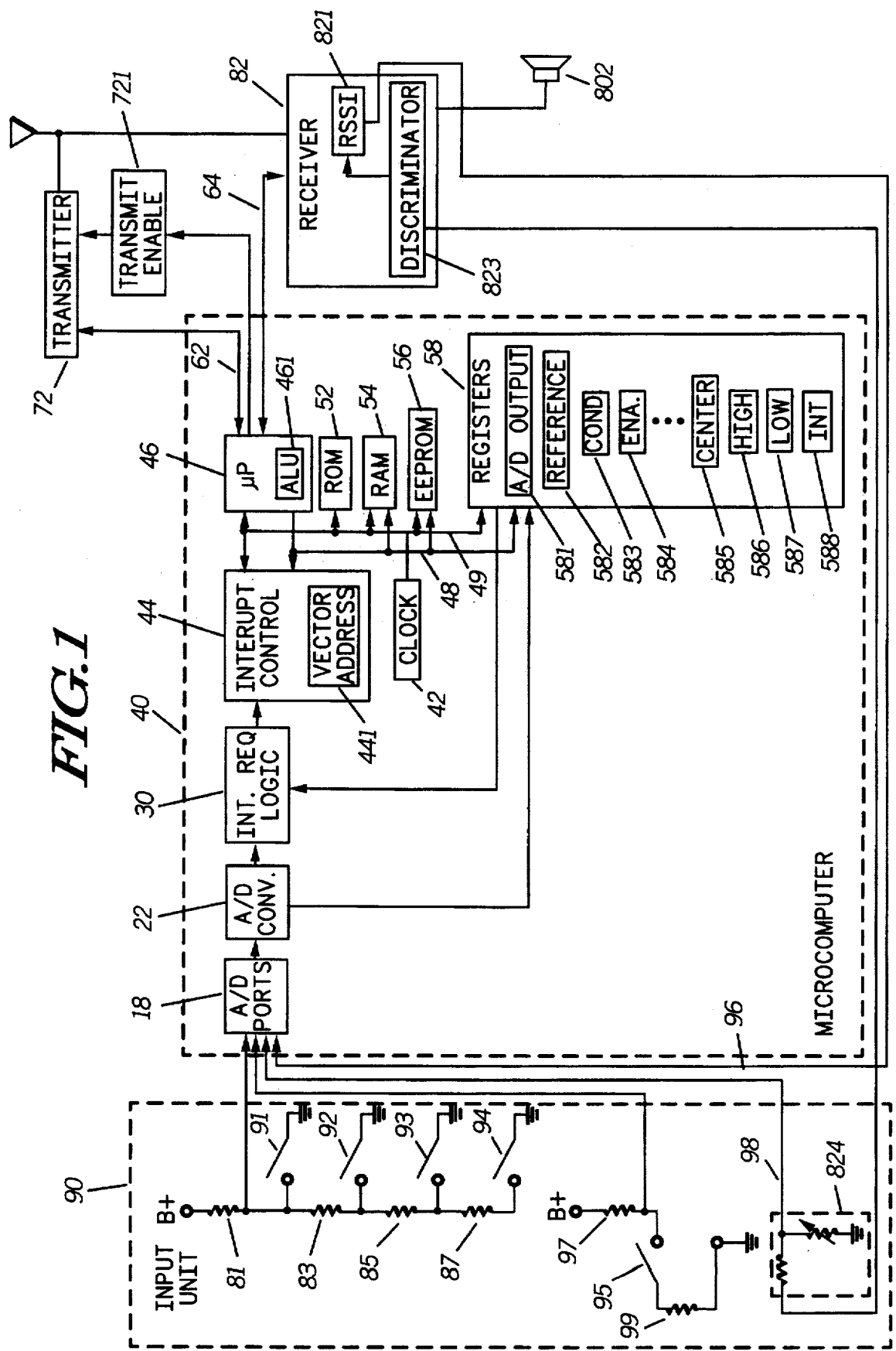

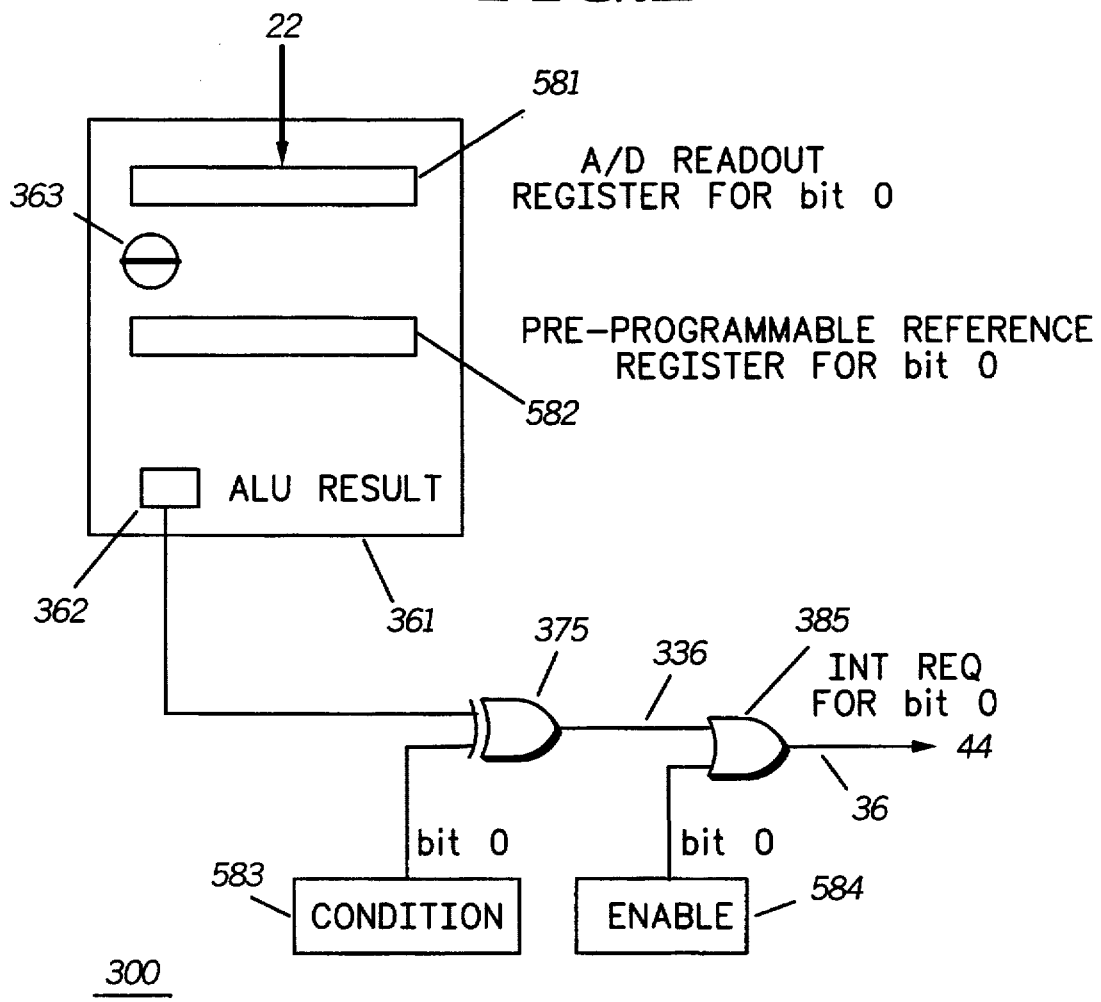

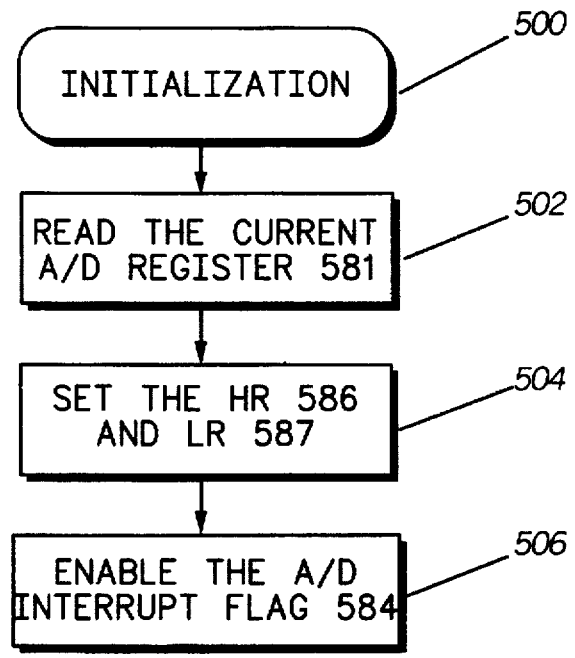
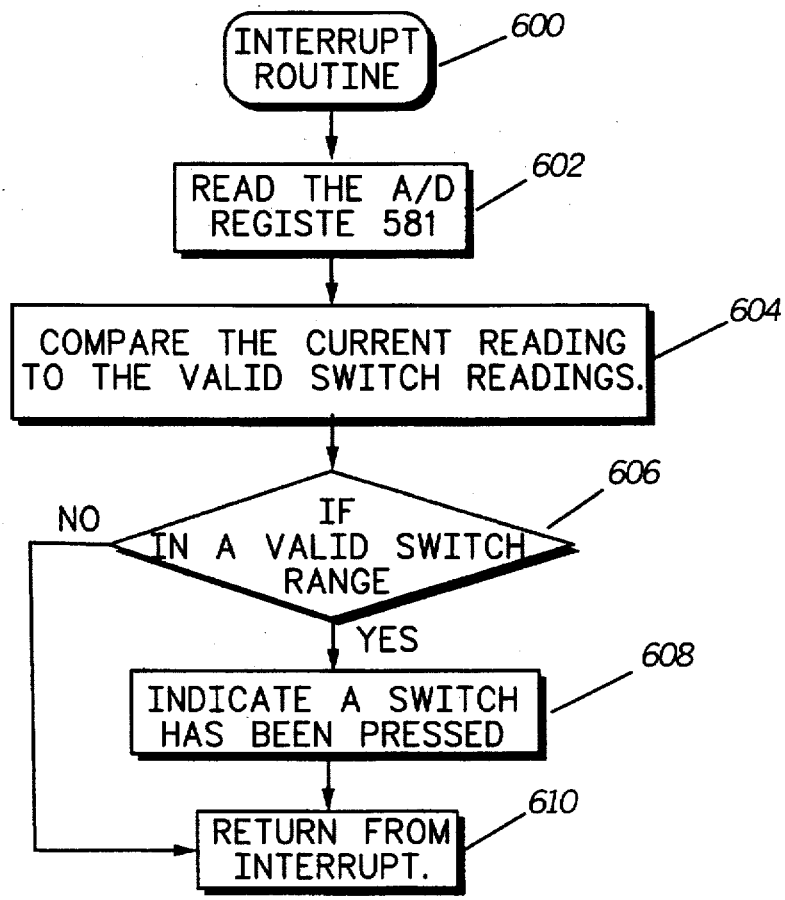

INTERRUPT PROGRAMMABLE ANALOG-TO-DIGITAL PORT

TECHNICAL FIELD

This invention relates generally to microcomputers, and more particularly to an architecture of a microcomputer for controlling a radio transceiver.

BACKGROUND

As electronic devices, such as radio transceivers, decrease in size, but increase in complexity, to accommodate more features, the control circuitry of these transceivers becomes increasingly sophisticated. This need for more sophisticated radio control units has resulted in the use of microcomputers for controlling the operation of a radio. Conventionally, a number of radio control signals from the radio are interconnected by appropriate interface circuitry to the microcomputer. The number of external interconnections can be reduced by utilizing microcomputers, such as the Motorola M68HC11, which include some interface circuitry on the same integrated circuit as the microcomputer.

An example of an interfacing circuitry is a switch matrix adapter that monitors a plurality of digital inputs, in order to provide one digital output to the interrupt port of the microcomputer, whenever one of the digital switch inputs was present. However, each of the switched inputs still has to be read, in order to determine which one generated the interrupt.

Microprocessors are commonly provided with one or more ports for sensing an interrupt. Software is generally provided to process or handle interrupts whenever they occur. However, none of the prior art microcomputers can interrupt the microcomputer directly, based on an analog voltage, without using external hardware. The Motorola M68HC11, for example, lacks the capability to interrupt directly on an analog voltage that is coupled to an analog-to-digital (A/D) port, even though it allows the reading, or polling, of the A/D voltage level.

Radio control switch actuations, such as for push-to-transmit (PTT) or emergency, or any other non-digital amplitude changes are sometimes detected through a voltage level reading of the analog-to-digital port. A conventional voltage divider circuit associates a different voltage level with each of the switches multiplexed on the same line. The output of this voltage divider circuit is connected to the ND port to allow the identification of which switch was pressed by the specific voltage level read from the A/D port. However, the timing of this reading is controlled by the software and is usually done periodically, as in polling. This periodically polling, though, increases the processing time that the microcomputer has to be operating and results in high current drain.

However, when and how to trigger an interrupt, while saving current, is the problem to be solved. Sometimes, a switch closure or any other analog output, such as from a detector, or a filter, having a high priority, must be detected as soon as it occurs (that is, before the next polled reading). This high priority analog output is directly connected to the interrupt port for the software to interrupt as soon as the switch closure occurs. This type of interrupt-driven operation, is a more flexible approach than the polled method, previously described, because the microcomputer can be performing other tasks while waiting for a particular voltage level-triggered event.

However, the conventional interrupt port is a digital input. The digital input, on the microcomputer, cannot sense a change of state on the line if the input voltage level does not fall below or rise above a defined valid threshold voltage. To resolve this problem, additional interface circuitry is used to translate the voltage level of the analog output (whether it is from a single switch or another electronic device, or it is from the output of the voltage divider circuit) into a valid interrupt trigger digital level. However, if the voltage divider circuit was used, two input ports, the A/D and the interrupt ports, are wasted by having both connected to the interface circuitry for a hardwired interrupt. Furthermore, the interface circuitry adds additional components which take up space on an already crowded controller board.

SUMMARY OF THE INVENTION

Briefly, according to the invention, a voltage monitoring method and apparatus starts with the operation of a normal microcomputer program flow, in a microcomputer. An input voltage source is converted to a current digital output word representative of the instantaneous amplitudes of the input voltage source. A threshold condition is set ahead of time. When the current digital output word satisfies the threshold condition, an interrupt signal is generated. Finally, the normal microcomputer program flow is interrupted in response to the interrupt signal.

In one embodiment of the invention, a threshold window is set having a range around the threshold condition. The interrupt signal is now generated when the current digital output word is outside the range of the threshold window. Subsequently, a new digital output word is read and a new threshold window is centered having the range around the value of the new digital output.

In one aspect of the invention, a microcomputer comprises an analog-to-digital port coupled to an input voltage source. An analog-to-digital converter, coupled to the analog-to-digital port converts the input voltage source to a digital output representative of instantaneous amplitudes of the input voltage source. A detector, coupled to the analog-to-digital converter, detects whether or not the digital output satisfies a threshold condition and produces a detection signal when the threshold condition is satisfied. An interrupt enabler provides an active level for anticipating an interrupt and an inactive level when not anticipating the interrupt. A monitor, coupled to the detector and to the interrupt enabler, and responsive to the detection signal, monitors the level of the interrupt enabler for producing an interruption request signal when the interrupt enabler is at the active level. An interrupt generator, coupled to the monitor and responsive to the interruption request signal, generates the interrupt which causes the microcomputer to execute an interruption program routine.

In another aspect of the invention, a radio comprises an analog input source for providing an analog input signal, representing a radio operating status. A microcomputer coupled to the analog input source processes a normal operating routine of tasks. Hardware, within the microcomputer, compares the analog input signal to a predetermined threshold, and generates a control signal if the threshold is satisfied. A processor, also internal of the microcomputer and coupled to the hardware, and responsive to the control signal, provides an internal interrupt signal to interrupt the processing of the normal operating routine of tasks.

BRIEF DESCRIPTION OF THE DRAWINGS

FIG. 1 is a block diagram of a radio in accordance with the present invention.

FIG. 2 is a block diagram of one embodiment of the interrupt request logic block 30 of FIG. 1.

FIG. 3 is a truth table for the interrupt request logic block 300 of FIG. 2.

FIG. 5 is a flow diagram for initializing the interrupt request logic block 400 of FIG. 4.

FIG. 6 is a flow diagram of an interrupt routine for the interrupt request logic block 400 of FIG. 4.

DETAILED DESCRIPTION OF THE PREFERRED EMBODIMENT

Figure 4:
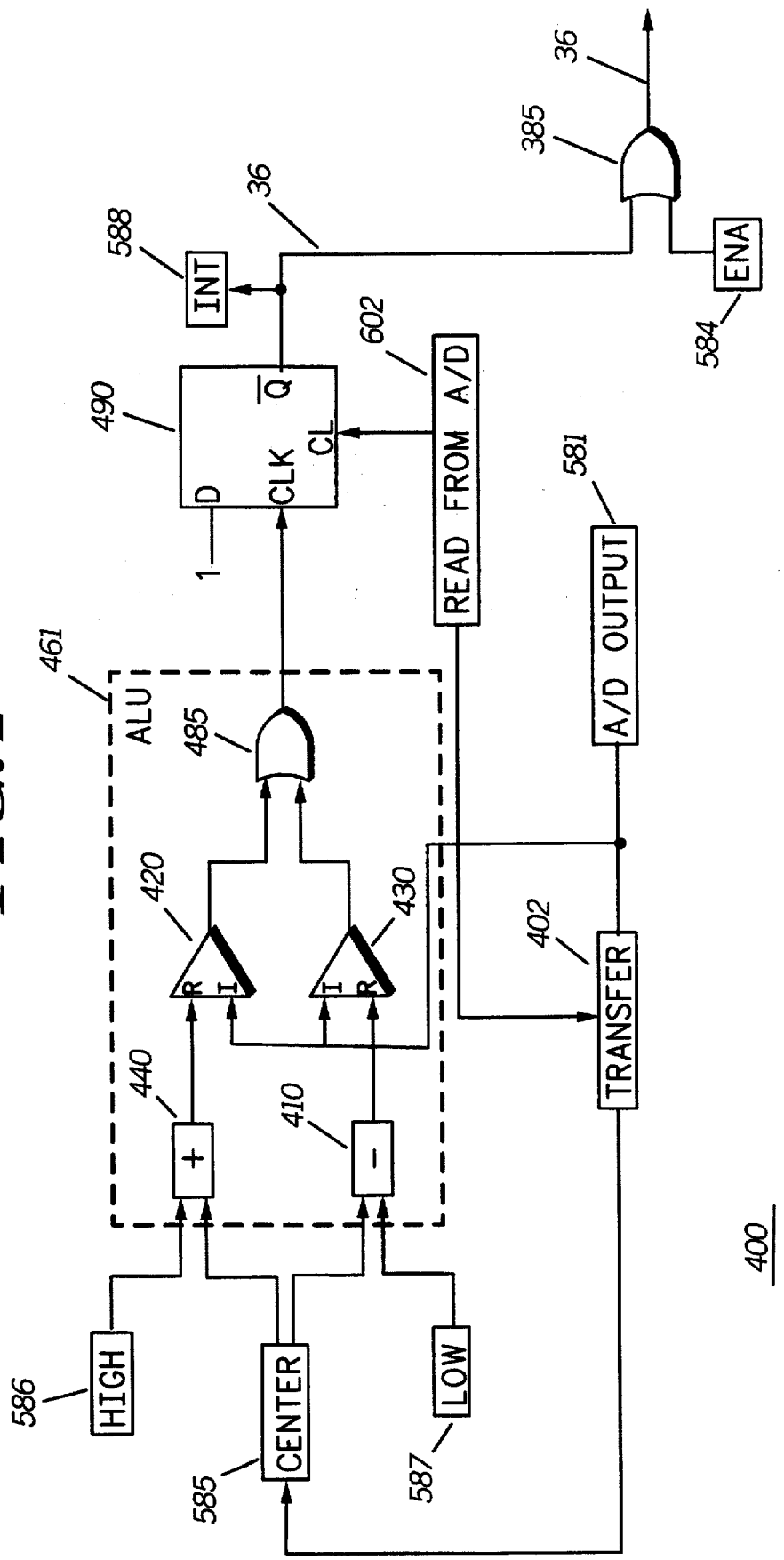
FIG. 4 is a block diagram of an alternate embodiment of the interrupt request logic block 30 of FIG. 1.

Referring to FIG. 1, there is illustrated a block diagram of an electronic device, such as a radio 100. The radio 100 includes a microcontroller or microcomputer system 40 having a microprocessor 46 together with peripheral or subsystem devices comprising at least 22, 30, 42, 44, 52, 54, 56, and 58, and a status or control voltage indicating input unit 90.

The microprocessor 46 and related peripheral devices 22, 30, 42, 44, 52, 54, 56, and 58 are of the type that may readily be integrated into a semiconductive substrate, such as CMOS, and provided individually or together on an integrated circuit.

Several peripheral functions are especially useful with, or part of, the present invention. For example, an analog voltage monitoring circuit, such as an analog-to-digital (A/D) converter 22 is provided on-chip within the microcomputer 40.

A clock signal, as derived from a clock 42, is applied to the microprocessor 46 to control the rate signals are processed. It is understood that the microprocessor 46 uses the clock 42 for controlling internal operations as well as its interface with other elements of the microcomputer 40, such as a free-running interrupt control and timer system 44 having a real-time interrupt function. The interrupt control 44 provides the microprocessor 46 with time and interrupt information in a manner well known in the art. The interrupt control 44 includes clock and interrupt control circuitry which is responsive to an interrupt request signal 36 for providing an INT signal during interrupts. In addition, the interrupt control and timer system 44 includes a register 441 for storing a vector address representative of a leading address of an interruption program routine.

In accordance with the invention, a particular peripheral device, an interrupt request logic circuitry block 30, is preferably integrated within the microcomputer 40. The interrupt request logic 30, causes the microprocessor 46 to execute an interrupt by placing a momentary binary zero state on an interruption request or control signal 36. This control signal 36 to enable an interrupt is provided by the interruption request logic 30 depending upon the particular instruction being executed and the binary states of a set of registers and flags 58. Flags 583, 584, and 588 are single bit registers containing only one bit. All of the registers are latching type registers to allow for transfers between registers, after a full clock cycle interval.

The microprocessor 46 and related peripheral devices 22, 30, 42, 44, 52, 54, 56, and 58 have been architectured such that the high priority signals coupled by the input unit 90 are handled on a high speed interrupt basis by the interruption request logic 30.

The architecture of the microcomputer 40 is further organized around two buses, a data bus 49 and an address bus 48. Data signals are routed between the various blocks of the microcomputer 40 by selectively interconnecting the two buses 48 and 50, in response to control signals provided by an arithmetic logic unit (ALU) 461 located within the microprocessor 46.

As can be seen by reference to FIG. 1, the radio 100 comprises a transmitter 72 and a receiver 82, which are controlled (62 and 64 respectively) by the microprocessor 46. The receiver 82 receives signals and demodulates these received signals in a discriminator 823 to provide data (64) to the microprocessor 46 and voice signals to an appropriate audio transducer system, such as a speaker 802. One discriminator output signal 823 passes through a volume control switch 824 before having the received voice signals rendered audible at the speaker 802.

The microprocessor 46 communicates via the address bus 48 and the data bus 49 with a sufficient amount of read-only memory (ROM) 52, random access memory (RAM) 54, and electronically erasable programmable read-only memory (EEPROM) 56. Preferably, the operational instructions (control program) for the microprocessor 46 reside in the ROM 52, while temporary and semi-permanent information is stored in the RAM 54 and EEPROM 56, respectively.

The A/D ports 18 are used to receive analog voltage inputs. The microcomputer 40 receives input signals from the input unit 90, as operated by an operator or caused by an analog event. The voltage indicating input unit 90 provides analog information regarding certain functions of the radio. A plurality of A/D ports 18 provides input capability between a plurality of prioritized input switches 91–94, a single input switch 95, or other input analog signals, such as a signal 96 carrying the analog voltage representation of a received strength signal indication (RSSI) 821, or a signal 98 carrying the analog voltage representation of the volume control setting, in the input unit 90, and a plurality of A/D converters 22 of the microcomputer 40. It is understood that the plurality of input switches can include more than the number of input switches shown and referenced. Each one of the A/D converters receives the analog voltage via one of the A/D ports 18, in order for the interrupt request logic 30 to operate on each of the connected A/D ports 18 to enable microprocessor interruption, if applicable.

Each of the A/D converters 22, are used to gather analog voltage information (such as RSSI) 96 for determining a state, or status, of the radio 100, as provided by the input unit 90. For switched inputs, one of the A/D converters 22 operates in conjunction with a biased (97) resistor 99 to determine whether the switch 95 was closed to indicate a particular status of the radio 100. Alternatively, one of the A/D converters 22 operates in conjunction with one or more of a plurality of biased "switch coding" resistors 81,83, 85, and 87, in a well-known switch activated voltage divider ladder network to provide analog voltage information, depending on which one of the switches 91–94 having the highest priority was pressed (in this embodiment, switch 91 has the highest priority and switch 94 has the lowest). More than one of the switches 91–94 can be closed at the same time. However, the detection of a higher priority switch will override the detection of a lower priority switch. After the higher priority switch has been released, though, the closure of the lower priority switch can be detected. To detect one or more of the radio's multiple states, each of the closed switches 91–94 provides the analog information on the same line, in a predetermined prioritized order.

In this exemplary embodiment, the input unit 90 includes a push-to-transmit PTT switch 91, having the highest priority, and a single switch input such as an emergency or remote microphone switch 95 to allow an operator to cause an internal microprocessor hardware interruption based on the received input on an ND port. So configured, closing either switch 91 or 95 will provide an analog input signal at one of the A/D ports 18 to interrupt the microprocessor 46. For example, the microprocessor 46 responds to the PTT switch 91 or the emergency switch 95 by causing a transmit enable unit 721 to enable the transmitter 72. In this manner, the microprocessor 46 can trigger one of the desired functions, such as the emergency transmission function of the radio by interrupting the normal routine of tasks.

According to the invention, the microprocessor 46 is able to determine a particular operating state of the radio 100 by analyzing the digital (22) version of the voltage applied directly via an analog input line 96, 98, or across none (91), one (95), or more (91–94) of the resistors 99, 83, 85, and 87. In this way, the interrupt request logic 30 may provide feedback to the microprocessor 46 so as to interrupt the program processing, whenever necessary.

Operationally, the radio 100 communicates via the input unit 90 to provide information regarding, for example, the radio's operational status, such as, transmitting (push-to-transmit PTT switch 91 is closed); receiving (push-to-transmit PTT switch 91 is not closed); standby (monitor channel switch 92 is closed); signaling (repeater access tone one RAT1 switch 93 or tone two RAT2 switch 94 is not closed), or other control voltages which may represent widely varying parameters such as speaker volume setting (824), power output limitations and the like. In any event, the microprocessor uses this data to determine whether to interrupt the operating software. Further, the present invention permits adjustments (e.g., between speaker volume levels 824) to be rapidly made to the radio 100 because of the internally hardwired interruptable A/D port to minimize microprocessor processing time. Instead of being polled on a time available basis, the analog voltage levels at each of the A/D ports 18 are constantly monitored by the A/D converters 22 and processed by the interrupt request logic 30.

Referring to FIGS. 1 and 2, one embodiment 300 of the interrupt request logic 30, for each of the A/D converters 22 is illustrated. One A/D digital readout or output register 581, a corresponding programmable reference register 582, and a dedicated ALU 361, are provided for each bit or port of the A/D ports 18. Each A/D input bit of the A/D ports 18 is then associated with an interrupt absolute level reference register 582 that is user-programmable. This embodiment 300 can be used in a single switch 95 or analog event 96 or 98 application where the detection of the voltage level above or below an absolute reference level is desired to trigger an interrupt.

Two flags are associated with each bit of the A/D ports 18 of FIG. 1. The first flag is the interrupt control or enable bit in the enable register 584. If this bit is set to zero, then interrupts are enabled for that particular input port. The second flag is in the condition register 583 and designates the state that causes the interrupt. There are two logical states greater (>) or less (<) which an exclusive OR gate 375 of FIG. 2 references in order to determine if an interrupt pending signal 336 needs to occur, according to the truth table of FIG. 3.

Referring to FIG. 2, the binary signals appearing at the output of each of the A/D converters 22 form a train of binary signals which are automatically coupled, without a software read, into the A/D digital output register 581. As is known, a binary word consists of a predetermined order of binary digits or bits, wherein each bit has a predetermined period.

The pre-programmable reference register 582 stores the bits of the binary word that is desired to be referenced as an absolute threshold condition. The output 362 of the ALU provides a comparison result and is a binary zero for no carry and a binary one for carry. An internal carry flag (flip-flop) receives a carry signal from the dedicated ALU 361, in order to change states. The carry flag has a binary one state if a carry has resulted from an arithmetic operation in ALU 21 3 (for example, if the AID output register value is less than the pre-programmable reference register 582 value for a subtraction operation 363). Otherwise, the carry flag is cleared to a binary zero state (for example, if the A/D output register 582 value is greater than or equal to the pre-programmable reference register 582 value for the subtraction operation 363). The dedicated ALU 361 operates on signals from the A/D output register 581 and the pre-programmable reference register 582, in accordance with selected arithmetic and logical combining functions.

The binary signal of the dedicated ALU carry output 362 is applied to one input of the exclusive OR gate 375. The single bit content of the condition register 583 is coupled to a second input of the exclusive OR gate 375. If the two inputs to the exclusive OR gate 15, one from the ALU output 362 and the other from the condition register 583, do not correspond, the exclusive OR gate 375 will develop an interrupt pending signal 336, in accordance with the table of FIG. 3. Comprising a monitoring means, one input of an OR gate 385 is connected to receive the interrupt pending signal 336, indicative of the interrupting pending condition.

The other input of the OR gate 385 is connected to receive a disable (1) or enable (0) signal, based on the content of the enable register 584. Using reverse logic, the OR gate 385 is disabled by the output of the interrupt mask/enable register 584, providing for the masking or enabling of interrupts under program control. If it is desired to mask interrupts by setting an interrupt mask or enable flag 584, a write for loading information to this register 584 by the software is executed, setting the output of the interrupt mask or enable flag 584 to a binary one state. If it is desired to remove the masking of interrupts, as in normal analog voltage detection applications, the output of the interrupt mask or enable flag 584 can be set to a binary zero state by executing a write to this register.

The output of the OR gate 385 provides the internal interruption request signal 36 which is internally sent to the interrupt and timer control logic 44 of FIG. 1 to cause an interrupt. In response to the interrupt request signal 36, the interrupt and timer control logic 44 executes the interruption program, found in the starting vector address of register 441.

If the interrupt request logic blocks 300 of more than one A/D port have their interrupt request signal 36 vectored to the same address, the interruption program routine might include instructions to read the A/D output which was stored at the register 581 to determine which switch has been pushed, or which analog event has occurred in order to jump to another routine to execute the associated processing steps. Otherwise, each of the interrupt request signals 36 for each of the ports may be vectored to a different address for starting different routines.

The interruption program routine may also include changing the threshold condition to the opposite comparison state, having the absolute threshold value set at the value stored at the A/D output register 581, or a debounced value close to the current threshold value, or a new level, to determine when the current switch has been released or the analog event has passed. When the execution of the interruption program routine is completed, the executing state of the microprocessor 46 is returned to the main program routine to decode the next instruction.

Referring to FIG. 4, an alternate embodiment 400 of the interrupt request logic 30 of FIG. 1 is shown for each of the A/D converters 22. This embodiment 300 can be used in a single switch 95 or analog event 96 or 98 application or multiple switched inputs 91–94 where the detection of a specified amount of voltage change above or below a corresponding side of a reference window is desired to trigger an interrupt. For example, this embodiment 400 is especially suited for the case when there are more than one voltage input, having voltage levels at different voltage increments, that may be applied on the same line, and a need exists to determine which input is occurring, when it is completed, which input is occurring next, and so on.

In another dedicated ALU 461, the contents of the A/D output register 581 is initially read in step 502 of FIG. 5, selectively transferred (402) to the current window center register 585, to an IN input of a HIGH comparator 420, and to an IN input of a LOW comparator 430. The contents of the A/D output register is constantly changing, as the output of the ND changes. Hence, the current AID output is constantly checked by the comparators 420 and 430.

However, the transfer gate 402 prevents the contents of the current window center 585 from changing until another software read 602 occurs. Only after an interrupt, is the output of the A/D converter 22 of FIG. 1 read by the software again, instead of being constantly polled, as in conventional systems. After an interrupt, the A/D output is read 602, and the output register 581 containing the just read A/D output value is transferred into the current window center register 585. Thus, the center window 585 represents the last read A/D output that the software has made.

The window thresholds are set up by a software write with the desired relative offset values into the High register 586 and Low register 587. Of course, the contents in both the Low 587 and High 586 registers can be the same to form a threshold window centered at the last read A/D output found in the center register 585. The offset values represent the maximum amount of positive or negative change allowable which will not trigger an interrupt. These offsets are provided to prevent false interrupt triggering on normal fluctuations, such as due to the presence of noise. The offsets are set to be at smaller increments than the increments denoting different switch inputs, in order to detect a switch release after a closure has been detected.

The contents written or programmed in the High register 586 is added to the contents read from the center register 585 in an incrementor or adder 440. Similarly, the contents written in the Low register 587 is subtracted from the contents read from the center register 585 in a subtractor circuit 410. The sum output of the adder 420, if less than a maximum allowable limit of the comparator 420, such as 255 for an eight bit word, is used as the output. Otherwise, the maximum allowable limit is used as the reference or threshold. Similarly, the difference output of the subtractor circuit 410, if less than a minimum allowable limit of the comparator 430, such as 0 for an eight bit word, is used as the output. Otherwise, the minimum allowable limit is used as the reference.

The outputs from the adder 440 and the subtractor circuit 410 are coupled to the reference R inputs of the comparators 420 and 430 and used as references. If the current A/D output, as received on the IN input, is greater than the reference found on the reference R input, the high comparator 420 outputs a binary one. Likewise, if the current A/D output, as received on the I input, is less than the reference found on the R input, the low comparator 430 outputs a binary one.

The outputs from the first 420 and second 430 comparators are coupled to the inputs of an OR gate 485. If the current A/D output is outside of the window defined by the two comparators 420 and 430, a binary one state of one of the comparators will be coupled via the OR gate 485 to form a low to high transition on a clock CLK input of a flip-flop 490. This transition causes the high level at the D input to be transferred and complemented at the Q bar output of the flip-flop 490 to form the interrupt pending signal 36, switching to a binary zero state from a previously binary one state.

Meanwhile, the interrupt pending flag 588 is set to a zero. The D flip-flop 490 implements the interrupt pending flag 588 which gets set when an interrupt condition initially becomes pending. Thus, when the current A/D reading exceeds the sum of the contents of the center register 585 and the High register 586 or drops below the value stored in the center register 585 minus the offset of the Low register 410, the interrupt pending flag and signal 36 will be set to a binary zero.

The actual interrupt request signal 36 will only be generated if the interrupt pending flag 588 is set to a binary zero and the A/D interrupt is enabled (set to binary zero) by the enable flag 584. If the enable flag 584 has not been set for a binary zero, the microprocessor 46 of FIG. 1 is not disrupted from its other functions. The interrupt pending signal 36 is coupled to a monitoring means, such as the OR gate 385, in the same way as in the first embodiment 300 of FIG. 2 to generate the interrupt request signal 36.

Off course, if positive logic is desired, the Q output of the flip-flop 490 may be applied to one input of an AND gate having its other input enabled by a binary one active level enable flag. The output of the AND gate would then provide the interrupt request signal 36. Correspondingly, in the first embodiment 200, the interrupt pending signal 336 can be inverted in an inverter before being applied to the same positive logic AND gate. Other variations and modifications are within the scope and spirit of the invention.

After a return from the interrupt routine, the A/D output, would again be read 602 (more clearly seen in FIG. 6). This A/D reading 602 generates a pulse to set the Q bar output of the flip-flop 490 to prepare for the next interrupt. The interrupt pending flag 588 will get reset, by the microprocessor 46 of FIG. 1, when the software reads the A/D output 602. At the same time, the value of the current A/D output (as currently automatically loaded into the output register 581) is selectively transferred (402) and written to the center window 585 to set a new window, in preparation for that switch release, another switch closure, or another analog event, to occur.

Referring to FIG. 5, a flow diagram illustrating the steps executed by the microprocessor 46 of FIG. 4 is shown. The operating software or code of the radio is separated into a least foreground and background processes. The foreground process represents the actual interrupt code and performs functions, or tasks, well known in the art such as decoding, battery saving, and other time critical functions. The background process follows a normal program flow having interruptable code. The flowchart illustrated in FIG. 5 includes those background routines placed part of and in the beginning of the interruptable code, such as initialization 500, for effecting the initial reading of an A/D port via the readout register 581 in step 502. This initial register 581 reading 602 and data transfer of it into the center window 585 initially sets the center register 585 and clears out any old pending interrupts. In steps 504 and 506, the microprocessor 46 of FIG. 1 is initialized by setting the High 586 and Low 587 registers in step 504 and enabling the interrupt flag 584 in step 506.

When an A/D port output value satisfies the pre-set window condition, the normal program flow of the background process is interrupted and the microprocessor 46 is vectored to an interrupt routine 600 of FIG. 6 of the foreground.

Referring to FIG. 6, the A/D interrupt is enabled via software control of the interrupt control logic embodiment 400 for reading a switch or an analog input voltage, in accordance with the present invention. The interrupt routine 600, independent of the normal program flow, begins by determining the present operational status of the radio 100 of FIG. 1 by reading the A/D output stored in the output register 581 in step 602. In step 604, the microprocessor 46 compares the current reading with a set of valid switch readings, separated by the switch voltage level increments. The set of valid switch readings associate a range of different voltage levels for each switch. In decision block 606, the current reading is checked to see if it is in a valid switch range, then the software ascertains which one of the plurality of switches 91–94 of FIG. 1 has been closed (608), and thereby determine what action is required.

After servicing the interrupt, the routine returns from interrupt in step 610 to await additional data. The software then may again be interrupted, in response to a new operational radio status. The routine thus returns to the wait state of the normal program flow and waits for another timer interrupt.

In summary, the invention comprises a method and apparatus to generate an internal microprocessor interrupt when a particular A/D reading changes by a specified amount. To allow the normal processing stream to be interrupted, an interrupt triggered by the A/D port can be set. A threshold level is set by the software for the AID reading. If the threshold condition is met, an interrupt would be generated, or triggered, for immediate processing of the software task associated with the current A/D reading. Thus, the inventive microprocessor having an interrupt programmable A/D port is a very powerful signal processor and controller that can be advantageously utilized in any application where fast data manipulation is required. In ordinary operating mode, the microprocessor can be processing other tasks, instead of constantly polling the A/D port, in order to minimize current drain, thereby extending the battery life. When the operator pushes a button, or an analog event occurs, related circuitry within the microprocessor internally generates an interrupt to cause the microprocessor to determine which switch-closure or which event occurred and to react accordingly.

What is claimed is:

1. A voltage monitoring method comprising the steps of:
   in a microcomputer:
   providing an analog port for an input voltage source;
   operating in a particular microcomputer program flow;
   converting an input voltage from the analog port to a current digital output word representative of instantaneous amplitudes of the input voltage;
   automatically programming a threshold level corresponding to the input voltage;
   generating an interrupt signal when the current digital output word satisfies the threshold level; and
   interrupting the particular microcomputer program flow in response to the interrupt signal;
   automatically varying the threshold level to correspond with the input voltage based on the current digital output word representative of instantaneous amplitudes of the input voltage.

2. A voltage monitoring method comprising the steps of:
   in a microcomputer:
   providing an analog port for an input voltage source;
   operating a particular microcomputer program flow;
   converting an input voltage from the analog port to a current digital output work representation of instantaneous amplitudes of the input voltage;
   automatically programming a threshold condition corresponding to the input voltage;
   automatically setting a threshold window having a range around the threshold condition;
   generating an interrupt signal when the current signal output word is outside the range of the threshold window;
   interrupting the particular microcomputer program flow in response to the interrupt signal;
   reading a subsequent digital output word; and
   automatically centering a new threshold window having the range around the value of the subsequent digital output.

* * * * *

UNITED STATES PATENT AND TRADEMARK OFFICE
CERTIFICATE OF CORRECTION

PATENT NO. : 5,455,774
DATED : October 3, 1995
INVENTOR(S) : Khawand, et al.

It is certified that error appears in the above-identified patent and that said Letters Patent is hereby corrected as shown below:

Column 10, Line 32, after digital output delete "work representation" and insert -- word representative --

Signed and Sealed this

Twenty-third Day of January, 1996

Attest:

BRUCE LEHMAN

Attesting Officer        Commissioner of Patents and Trademarks